(12) United States Patent
Kim

(10) Patent No.: US 11,626,155 B2
(45) Date of Patent: Apr. 11, 2023

(54) MEMORY AND OPERATION METHOD HAVING A RANDOM SEED GENERATION CIRCUIT, RANDOM SIGNAL GENERATOR, AND AN ADDRESS SAMPLING CIRCUIT FOR SAMPLING ACTIVE ADDRESS

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 35 days.

(21) Appl. No.: 17/365,506

(22) Filed: Jul. 1, 2021

(65) Prior Publication Data
US 2022/0319574 A1    Oct. 6, 2022

(30) Foreign Application Priority Data
Mar. 31, 2021  (KR) .................. 10-2021-0041832

(51) Int. Cl.
*G11C 11/4078*    (2006.01)
*G11C 11/406*    (2006.01)

(52) U.S. Cl.
CPC ........ *G11C 11/4078* (2013.01); *G11C 11/406* (2013.01)

(58) Field of Classification Search
CPC .................. G11C 11/4078; G11C 11/406
USPC .................................. 365/149, 222
See application file for complete search history.

(56) References Cited

U.S. PATENT DOCUMENTS

| | | | |
|---|---|---|---|
| 7,904,494 B2 | 3/2011 | Cho et al. | |
| 9,383,969 B2* | 7/2016 | Van Der Sluis | ...... H04L 9/0866 |
| 10,170,174 B1* | 1/2019 | Ito | ...... G11C 11/40615 |
| 10,573,370 B2* | 2/2020 | Ito | ...... G11C 11/40615 |
| 11,211,110 B1* | 12/2021 | Ayyapureddi | ........ G11C 11/408 |
| 2020/0365208 A1* | 11/2020 | Schreck | .............. G11C 11/4094 |

* cited by examiner

*Primary Examiner* — Connie C Yoha
(74) *Attorney, Agent, or Firm* — IP & T Group LLP

(57) ABSTRACT

A memory includes: a random seed generation circuit suitable for generating a random seed including process variation information; a random signal generator suitable for generating a random signal that is randomly activated based on the random seed; and an address sampling circuit suitable for sampling an active address while the random signal is activated.

12 Claims, 5 Drawing Sheets

MEMORY AND OPERATION METHOD HAVING A RANDOM SEED GENERATION CIRCUIT, RANDOM SIGNAL GENERATOR, AND AN ADDRESS SAMPLING CIRCUIT FOR SAMPLING ACTIVE ADDRESS

CROSS-REFERENCE TO RELATED APPLICATIONS

The present application claims priority to Korean Patent Application No. 10-2021-0041832, filed on Mar. 31, 2021, which is incorporated herein by reference in its entirety.

BACKGROUND

1. Field

Various embodiments of the present invention relate to a memory.

2. Description of the Related Art

As the degree of integration of a memory increases, the spacing between a plurality of word lines included in the memory decreases. As the spacing between word lines decreases, the coupling effect between the neighboring word lines increases.

Whenever data is input or output to or from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as "row hammering." Since the data of a memory cell is damaged before the memory cell is refreshed due to word line disturbance, row hammering occurs.

FIG. 1 is a view illustrating row hammering.

In FIG. 1, 'WLL' may correspond to a word line with a large number of activations, and 'WLL−1' and 'WL+1' may be word lines disposed adjacent to 'WLL', that is, word lines disposed adjacent to the word line with a large number of activations. Also, 'CL' may indicate a memory cell that is coupled to the word line 'WLL', and 'CL−1' may indicate a memory cell that is coupled to the word line 'WLL−1', and 'CL+1' may indicate a memory cell that is coupled to the word line 'WLL+1'. Each memory cell may include a cell transistor (TL, TL−1, or TL+1) and a cell capacitor (CAPL, CAPL−1, and CAPL+1).

When the word line 'WLL' is activated or deactivated, the voltages of the word lines 'WLL−1' and 'WLL+1' may rise or fall due to the coupling effect occurring between the word line 'WLL' and the word line 'WLL−1' and the coupling effect occurring between the word line 'WLL' and the word line 'WLL+1', also affecting the amount of charges in the cell capacitors CL−1 and CL+1. Therefore, when the word line 'WLL' is frequently activated and the word line 'WLL' toggles between an activated state and a deactivated state, the change in the amount of charges stored in the cell capacitors CAPL−1 and CAPL+1 that are included in the 'CL−1' and the 'CL+1' may increase and the data in the memory cell may be deteriorated.

Also, the electromagnetic wave generated when the word line toggles between the activated state and the deactivated state may damage the data by introducing electrons into the cell capacitor of the memory cell coupled to a neighboring word line, or leaking electrons from the cell capacitor.

Row hammering is mainly caused by an external attack from the outside of a memory, such as a hacking. As a method for coping with a row hammering attack, a method of randomly sampling an activated row and refreshing neighboring rows of the sampled row may be used. Randomly sampled rows are highly likely to be over-activated, so this method may be used. However, since 100% complete randomization is difficult, if an external attacker finds the regularity of the random pattern, the above-described counter-measurement method may be inefficient.

SUMMARY

Embodiments of the present invention are directed to a technology capable of coping with a row hammering attack onto the memory.

In accordance with an embodiment of the present invention, a memory includes: a random seed generation circuit suitable for generating a random seed including process variation information; a random signal generator suitable for generating a random signal that is randomly activated based on the random seed; and an address sampling circuit suitable for sampling an active address while the random signal is activated.

In accordance with another embodiment of the present invention, a method for operating a memory includes: generating process variation information for the memory; generating a random seed based on the process variation information; generating a random signal that is randomly activated based on the random seed; and sampling an active address while the random signal is activated.

In accordance with still another embodiment of the present invention, a memory system includes: a plurality of memories, each memory including: a random seed generation circuit suitable for measuring process variation of the memory and generating a random seed based on the measured process variation, wherein the random seed changes whenever a refresh operation for the memory is ended; a random signal generator suitable for generating a random signal that is randomly activated based on the random seed; and an address sampling circuit suitable for generating an activation signal based on the random signal and an active signal, and sampling an active address associated with an active operation of the memory based on the activation signal to generate a sampling address indicating a row in which the active operation is to be performed.

DETAILED DESCRIPTION

Figure 1:
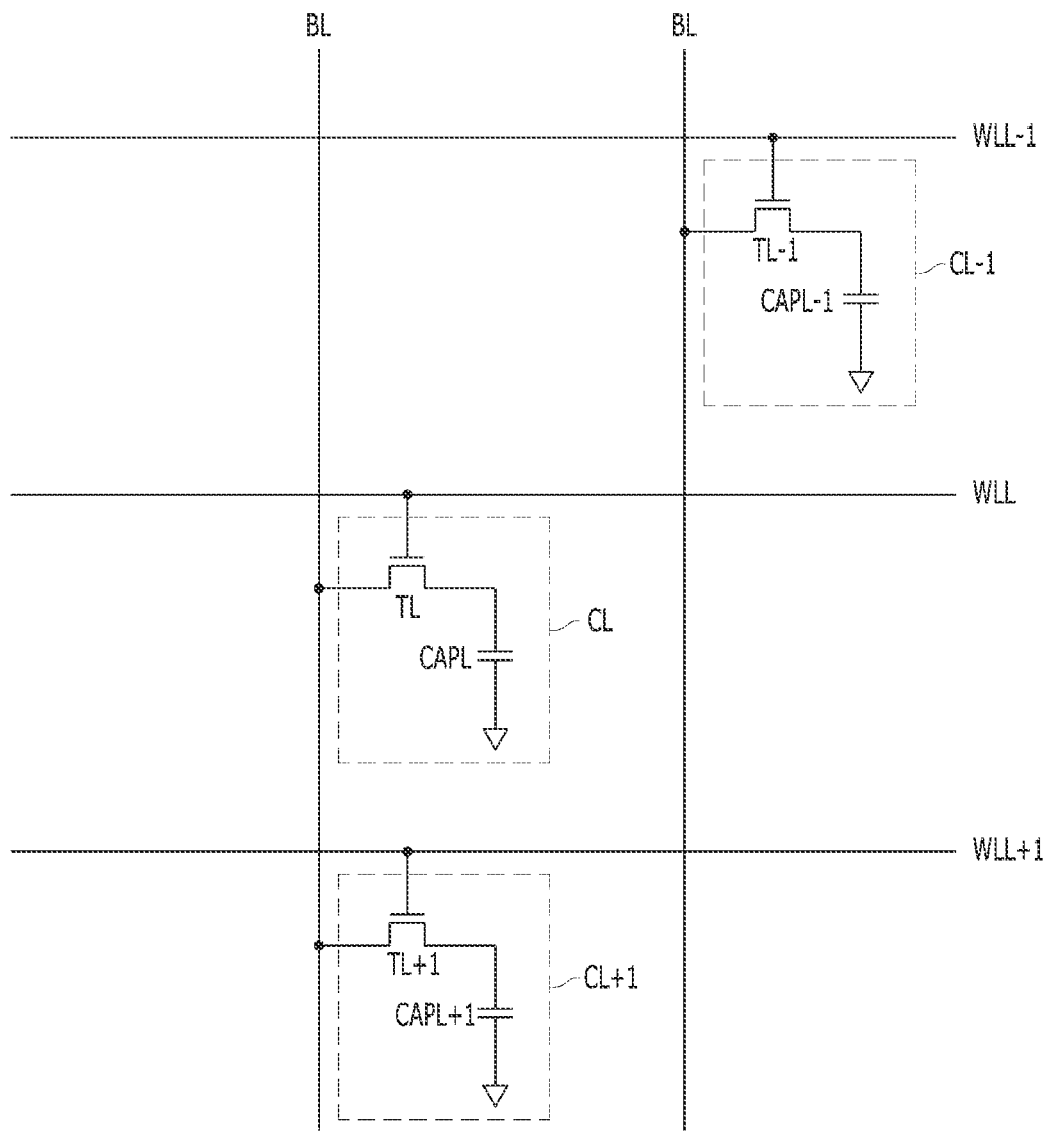
FIG. 1 is a view illustrating row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
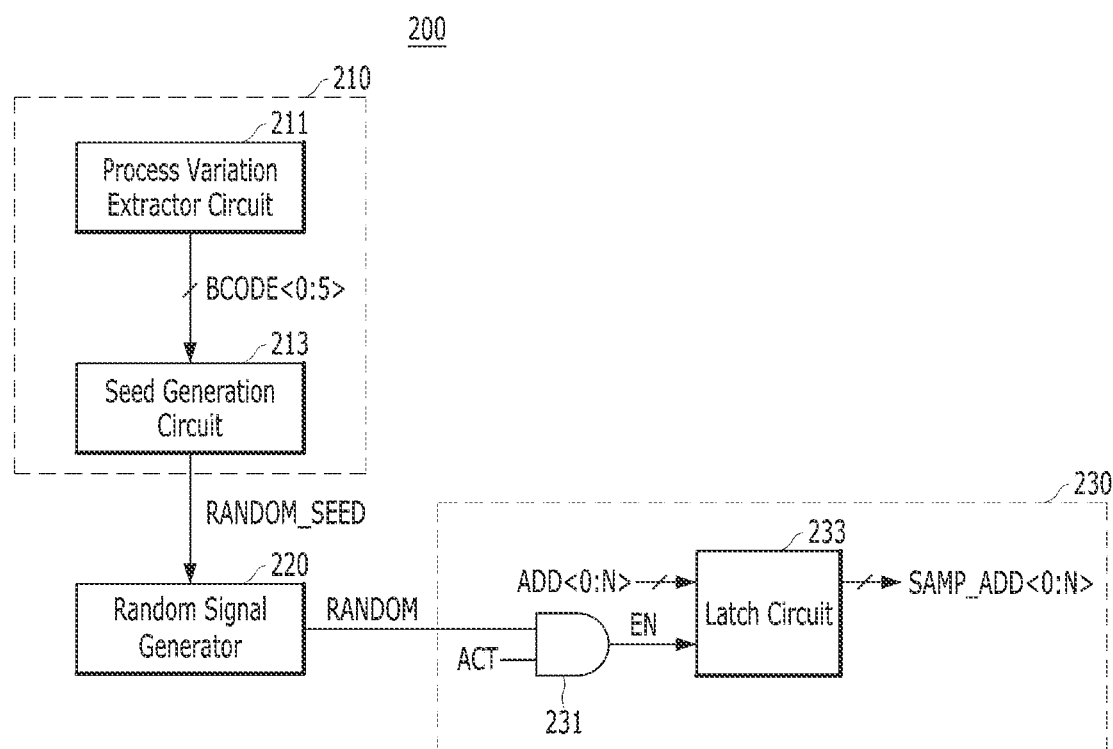
FIG. 2 is a block diagram illustrating a memory in accordance with an embodiment of the present invention.

FIG. 2 is a block diagram illustrating a memory 200 in accordance with an embodiment of the present invention. FIG. 2 illustrates components directly related to sampling an active address in the memory 200.

Referring to FIG. 2, the memory 200 may include a random seed generation circuit 210, a random signal generator 220, and an address sampling circuit 230.

The random seed generation circuit 210 may generate a random seed RANDOM_SEED including process variation information of the memory 200. The random seed RANDOM_SEED may be a signal that becomes the seed of a random signal RANDOM which is generated by the random signal generator 220. The random seed RANDOM_SEED may be generated based on the process variation information which is different for each memory 200. Therefore, the randomness of the random signal RANDOM may be further increased.

The random seed generation circuit 210 may include a process variation extractor circuit 211 and a seed generation circuit 213.

The process variation extractor circuit 211 may measure a process variation of the memory 200 and generate a process variation code BCODE<0:5> based on the measured process variation. The seed generation circuit 213 may generate the random seed RANDOM_SEED based on the process variation code BCODE<0:5>.

The random signal generator 220 may generate a random signal RANDOM based on the random seed RANDOM_SEED. The random signal RANDOM may have a pulse width which is proportional to the pulse width of the random seed RANDOM_SEED, or may have a period which is proportional to the period of the random seed RANDOM_SEED. The randomness of the random signal RANDOM generated by the random signal generator 220 may be affected by the random seed RANDOM_SEED, Since the random seed RANDOM_SEED reflects the process variation of the memory 200 and the process variation is different for each memory in a memory system, the randomness of the random signal RANDOM may be different for each memory. The random signal generator 220 may generate the random signal RANDOM by using a scheme such as a pseudo-random binary sequence (PRBS).

The address sampling circuit 230 may sample an active address while the random signal RANDOM is activated. Here, the active address may be an address that designates a row in which an active operation is performed. The address sampling circuit 230 may include an AND gate 231 and a latch circuit 233. The AND gate 231 may generate an activation signal EN that is activated in a section where both the random signal RANDOM and the active signal ACT are activated to a set level (e.g., a logic high level). The active signal ACT may be a signal that is activated during an active operation of the memory 200. The latch circuit 233 may receive and store addresses ADD<0:N> in a section where the activation signal EN is activated. Here, the addresses ADD<0:N> may be of multiple bits. Since the activation signal EN is activated in a section where the random signal RANDOM and the active signal ACT are activated to a set level (e.g., a logic high level), the latch circuit 233 may sample the address used for an active operation which is performed in the section where the random signal RANDOM is activated. The sampling address SAMP_ADD<0:N> may represent an address which is sampled by the address sampling circuit 230.

Figure 3:
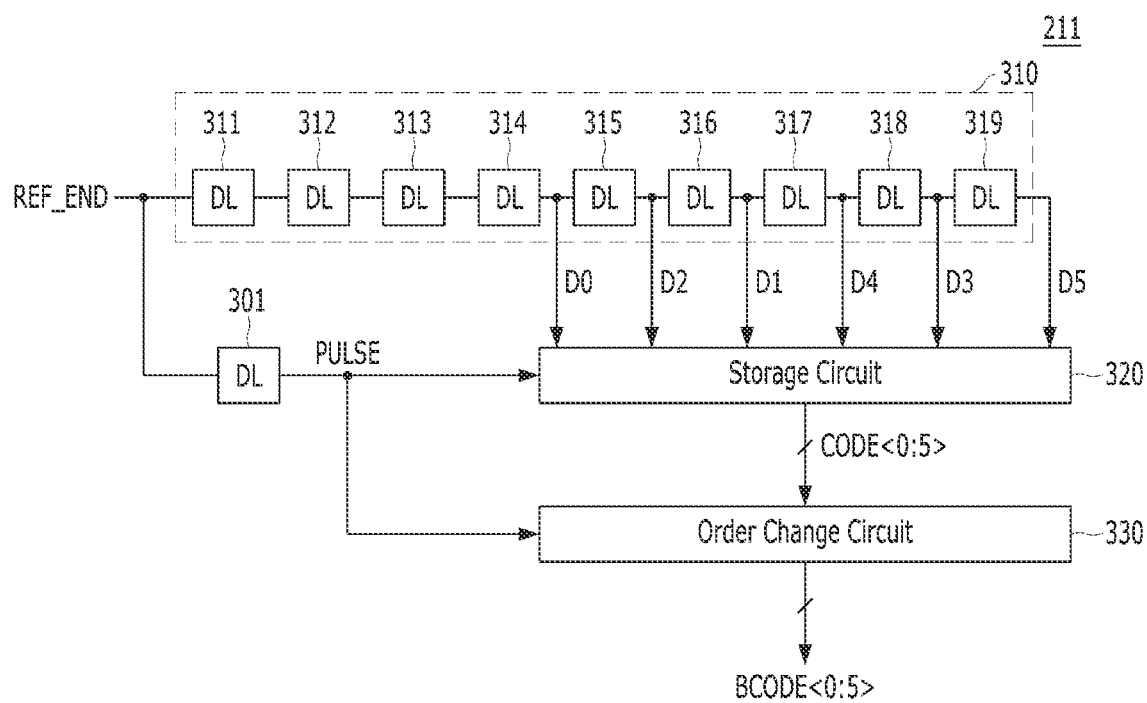
FIG. 3 is a block diagram illustrating a process variation extractor circuit in accordance with an embodiment of the present invention.

FIG. 3 is a block diagram illustrating a process variation extractor circuit in accordance with an embodiment of the present invention (e.g., a process variation extractor circuit 211 in FIG. 2).

Referring to FIG. 3, the process variation extractor circuit 211 may include a delay chain 310, a storage circuit 320, and an order change circuit 330.

The delay chain 310 may include a plurality of delay lines 311 to 319 for sequentially delaying a refresh end signal REF_END. Delay signals D0 to D5 may be signals generated by sequentially delaying the refresh end signal REF_END. The delay signal D0 may be the least delayed signal, and the delay signals D2, D1, D4, D3, and D5 may be further delayed signals that are further delayed in a set order (e.g., ascending order). For example, the delay signal D2 is generated by delaying the delay signal D0 through the delay line 315, the delay signal D1 is generated by delaying the delay signal D2 through the delay line 316, the delay signal D4 is generated by delaying the delay signal D1 through the delay line 317, the delay signal D3 is generated by delaying the delay signal D4 through the delay line 318, and the delay signal D5 is generated by delaying the delay signal D3 through the delay line 319. The order that the delay signals D0 to D5 are delayed are made different from the numerical order to further impart randomness. The delay values of the delay lines 311 to 319 may vary depending on the process variation of the memory 200. The refresh end signal REF_END may be a signal that is activated whenever one cycle of a refresh operation of the memory 200 is completed. In other words, whenever all the rows in the memory 200 are refreshed once, the refresh end signal REF_END may be activated.

The delay line 301 may generate a puke signal PULSE by delaying the end signal REF_END. The delay line 301 may be formed differently from the delay lines 311 to 319 of the delay chain 310 and may have a different delay value. For example, the delay lines 311 to 319 may be formed to have a delay value that varies greatly according to the process variation, and the delay line 301 may be formed to be less affected by the process variation.

The storage circuit 320 may store the delay signals D0 to D5 in response to a pulse signal PULSE. To be specific, the storage circuit 320 may receive and store the delay signals D0 to D5 at a rising edge of the pulse signal PULSE. The delay signals D0 to D5 sampled by the storage circuit 320 may become a preliminary code CODE<0:5>. The number of the preliminary code CODE<0:5> and the number of the delay signals D0 to D5 may be the same. For example, the delay signal D1 that is sampled at a rising edge of the pulse signal PULSE may be a preliminary code CODE<1>, and the delay signal D4 that is sampled at a rising edge of the pulse signal PULSE may be a preliminary code CODE<4>.

The order change circuit 330 may generate a process variation code BCODE<0:5> by changing the order of the preliminary code CODE<0:5>. The order change circuit 330 may generate the process variation code BCODE<0:5> by changing the order of the preliminary codes CODE<0:5> whenever the puke signal PULSE is activated, There may be various ways of changing the order, and one of the simple methods is shifting a code. For example, the preliminary code CODE<0:5> and the process variation code BCODE<0:5> may have a corresponding relation of CODE<0>=BCODE<0>, CODE<1>=BCODE<1>, CODE<2>=BCODE<2>, CODE<3>=BCODE<3>, CODE<4>=BCODE<4>, and CODE<5>=BCODE<5>. Then, when the pulse signal PULSE is activated, they may have a corresponding relation of CODE<1>=BCODE<0>, CODE<2>=BCODE<1>, CODE<3>=BCODE<2>, CODE<4>=BCODE<3>, CODE<5>=BCODE<4>, and CODE<0>=BCODE<5>. Here, when the pulse signal PULSE is activated again, the preliminary code CODE<0: 5> and the process variation code BCODE<0:5> may have a corresponding relation of CODE<2>=BCODE<0>, CODE<3>=BCODE<1>, CODE<4>=BCODE<2>, CODE<5>=BCODE<3>, CODE<0>=BCODE<4>, and CODE<1>=BCODE<5>.

The process variation extractor circuit 211 may generate a new preliminary code CODE<0:5> whenever the puke signal PULSE is activated. Therefore, since the delay values of the delay lines 311 to 319 in the delay chain 310 vary according to the changes in the memory environment, the value of the preliminary code CODE<0:5> may be changed whenever the pulse signal PULSE is activated. Also, the process variation extractor circuit 211 may change the correspondence between the preliminary code CODE<0:5> and the process variation code BCODE<0:5> whenever the pulse signal PULSE is activated. Therefore, it may be very difficult to find out the regularity of the process variation code BCODE<0:5> in an external device of the memory 200.

Moreover, although it is illustrated that the process variation extractor circuit 211 generates the process variation code BCODE<0:5> by changing the order of the preliminary code CODE<0:5>, it may be also designed to omit the order change circuit 330 from the process variation extractor circuit 211 and to output the preliminary code CODE<0:5> as a process variation code.

Figure 4:
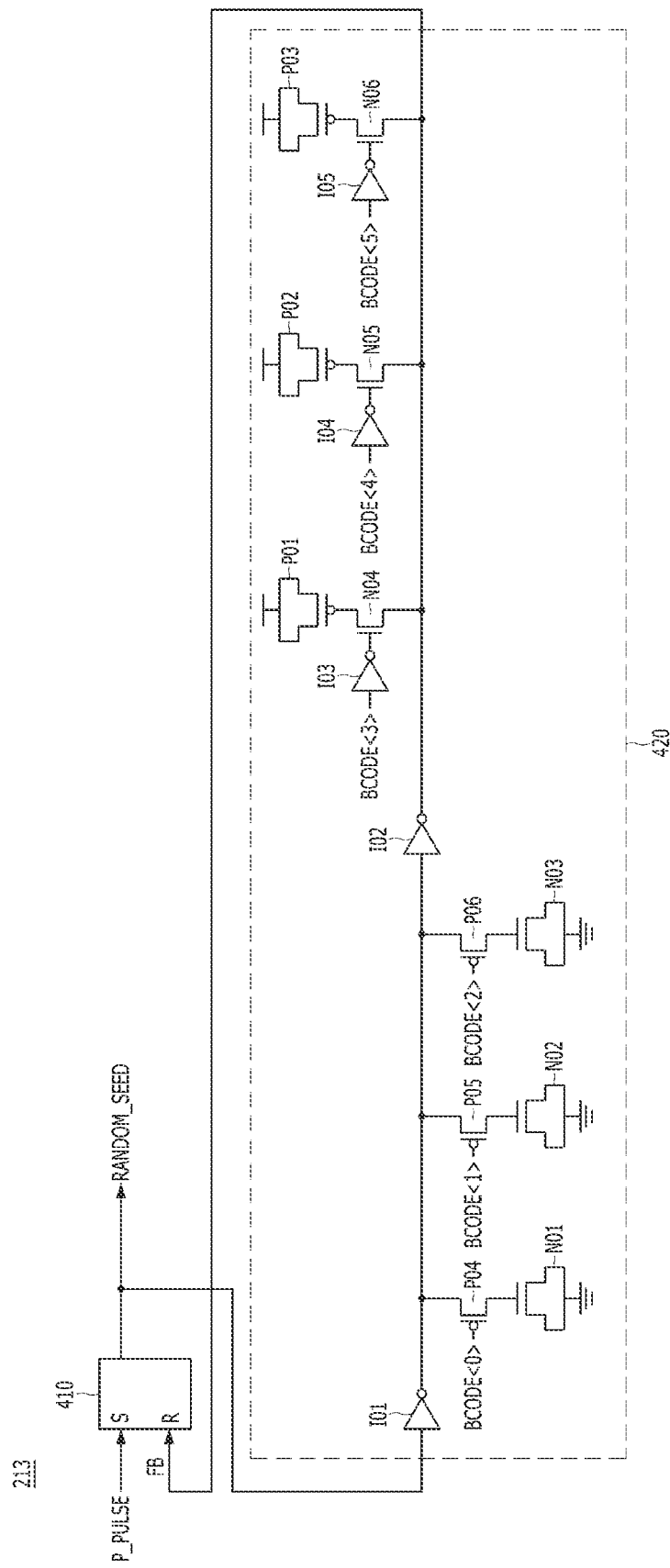
FIG. 4 is a block diagram illustrating a seed generation circuit in accordance with an embodiment of the present invention.

FIG. 4 is a block diagram illustrating a seed generation circuit in accordance with an embodiment of the present invention (e.g., a seed generation circuit 213 shown in FIG. 2).

Referring to FIG. 4, the seed generation circuit 213 may include an SR latch 410 and a variable delay line 420.

The SR latch 410 may activate (set) the random seed RANDOM_SEED to a set level (e.g., a logic high level) in response to activation of a periodic pulse signal P_PULSE and deactivate (reset) a random seed RANDOM_SEED to a set level (e.g., a logic low level) in response to activation of a feedback signal FB. The periodic pulse signal P_PULSE may be a signal activated at every period that is preset in the inside of the memory 200.

The variable delay line 420 may generate the feedback signal FB by delaying the random seed RANDOM_SEED. The delay value of the variable delay line 420 may be adjusted based on the process variation code BCODE<0:5>. The variable delay line 420 may include PMOS transistors P01 to P03 operating as capacitors, NMOS transistors N01 to N03 operating as capacitors, inverters I0:1 to 105, PMOS transistors P04 to P06 operating as switches, and NMOS transistors N04 and N06 operating as switches. Since the number of the capacitors P01 to P03 and N01 to N03 used for delay is determined based on the switches P04 to P06 and N04 to N06 that are turned on/off based on the process variation code BCODE<0:5>, the delay value of the variable delay line 420 may be determined based on the process variation code BCODE<0:5>. In order to diversify the delay value, the capacitances of the capacitors P01 to P03 and N01 to N03 may be designed differently.

The pulse width of the random seed RANDOM_SEED may be from a moment when the periodic pulse signal P_PULSE is activated to a moment when the feedback signal FB is activated. The time difference between the activation moment of the periodic pulse signal P_PULSE and the activation moment of the feedback signal FB may be determined based on the delay value of the variable delay line 420. Therefore, the pulse width of the random seed RANDOM_SEED may be determined based on the process variation code BCODE<0:5>.

Figure 5:
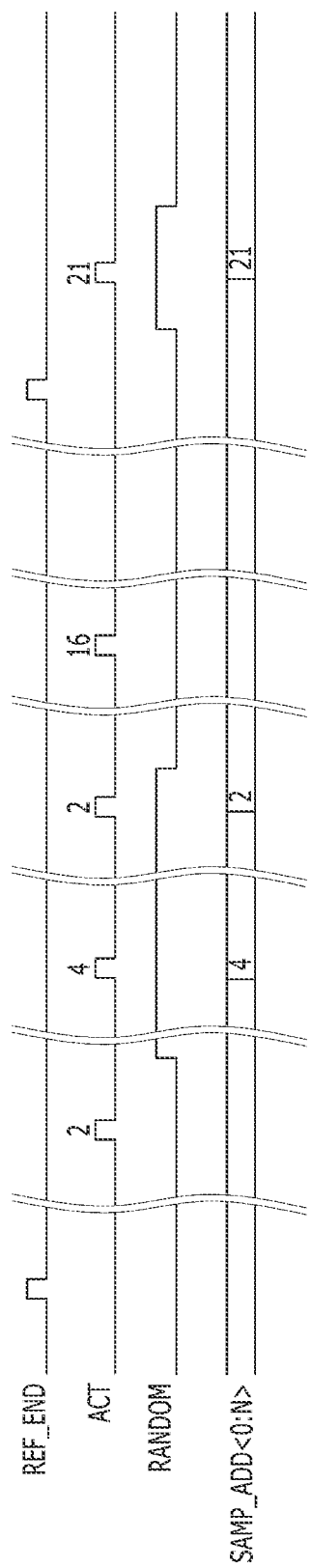
FIG. 5 is a timing diagram illustrating an operation of a memory in accordance with an embodiment of the present invention.

FIG. 5 is a timing diagram illustrating an operation of a memory in accordance with an embodiment of the present invention, for example, the memory 200 shown in FIG. 2.

Referring to FIG. 5, it may be seen that a refresh end signal REF_END is activated whenever one cycle of a refresh operation is completed. Referring to FIGS. 3 and 4, it may be seen that the process variation code BCODE<0:5> may be changed whenever the refresh end signal REF_END is activated. As a result, the pulse width of the random seed RANDOM_SEED may be changed whenever the refresh end signal REF_END is activated.

The numbers (e.g., 2, 4, 2, 16, 21) marked on the active signal ACT of FIG. 5 may indicate the number of the row in which an active operation is performed. The random signal RANDOM may be activated with a pulse width that is determined based on the pulse width of the random seed RANDOM_SEED at a random moment. In FIG. 4, when the random signal RANDOM is first activated, the random signal RANDOM may have a long pulse width. The address sampling circuit 230 may sample the active address when the random signal RANDOM is activated. When the random signal RANDOM is activated long, the last activated address is to be sampled while the random signal RANDOM is activated, consequently, the sampling address SAMP_ADD<0:N> may become '2'. When the random signal RANDOM is activated short, the sampling address SAMP_ADD<0:N> may become '4'.

In FIG. 5, the second activation of the random signal RANDOM may be performed after the refresh end signal REF_END is activated for the second time, that is, after the pulse width of the random seed RANDOM_SEED becomes different from the previous one. Accordingly, the pulse width of the random signal RANDOM may be shortened differently from before, Since an active operation is performed on the $21^{st}$ row during the activation of the random signal, the sampling address SAMP_ADD<0:N> may be '21'.

As illustrated in FIG. 5, a change in the pulse width of the random signal RANDOM may change an active address sampled by the address sampling circuit 230. In other words, the process variation of the memory 200 may affect the random seed RANDOM_SEED, and the random seed RANDOM_SEED may affect the random signal RANDOM, thereby affecting the active address sampled by the address sampling circuit 230. Consequently, the process variation of the memory 200 may increase the randomness for random sampling of an active address.

According to the embodiment of the present invention, the probability of a row hammering attack may be reduced.

While the present invention has been described with respect to the specific embodiments, it will be apparent to those skilled in the art that various changes and modifications may be made without departing from the spirit and scope of the invention as defined in the following claims. Furthermore, embodiments may be combined to form additional embodiments.

What is claimed is:

1. A memory comprising:
a random seed generation circuit suitable for generating a random seed including process variation information;
a random signal generator suitable for generating a random signal that is randomly activated based on the random seed; and
an address sampling circuit suitable for sampling an active address while the random signal is activated,
wherein the random seed generation circuit includes:
a process variation extractor circuit suitable for generating a process variation code; and
a seed generation circuit suitable for generating the random seed based on the process variation code, and
wherein the process variation extractor circuit includes:
a delay chain suitable for sequentially delaying a first signal to generate a plurality of delay signals;
a storage circuit suitable for generating a preliminary code by latching the delay signals in response to activation of a pulse signal; and
an order change circuit suitable for changing an order of the preliminary code to generate the process variation code.

2. The memory of claim 1, wherein the pulse signal is periodically activated, and
the order change circuit generates the process variation code by changing the order of the preliminary code whenever the pulse signal is activated.

3. The memory of claim 1, wherein the seed generation circuit generates the random seed whose pulse width corresponds to the process variation code.

4. A memory comprising:
a random seed generation circuit suitable for generating a random seed including process variation information;
a random signal generator suitable for generating a random signal that is randomly activated based on the random seed; and
an address sampling circuit suitable for sampling an active address while the random signal is activated,
wherein the random seed generation circuit includes:
a process variation extractor circuit suitable for generating a process variation code; and
a seed generation circuit suitable for generating the random seed whose pulse width corresponds to the process variation code, based on the process variation code, and
wherein the seed generation circuit includes:
a latch suitable for activating the random seed in response to activation of a second signal and deactivating the random seed in response to a feedback signal; and
a variable delay line suitable for generating the feedback signal by delaying the random seed, a delay value of the variable delay line being adjusted based on the process variation code.

5. The memory of claim 1, wherein a pulse width of the random seed and a pulse width of the random signal are in a proportional relationship.

6. The memory of claim 1, wherein the address sampling circuit samples a last input active address while the random signal is activated.

7. The memory of claim 1, wherein during a refresh operation, neighboring rows of a row corresponding to the active address that is sampled by the address sampling circuit are refreshed.

8. A method for operating a memory, the method comprising:
generating process variation information for the memory;
generating a random seed based on the process variation information;
generating a random signal that is randomly activated based on the random seed; and
sampling an active address while the random signal is activated,
wherein the generating the process variation information for the memory includes:
generating a plurality of delayed signals by sequentially delaying a first signal;
generating a preliminary code by latching the delay signals in response to activation of a pulse signal; and
generating a process variation code by changing an order of the preliminary codes.

9. The method of claim 8, further comprising:
refreshing neighboring rows adjacent to a row corresponding to the active address that is sampled in the sampling of the active address.

10. The method of claim 8, wherein the generating the random seed based on the process variation information includes;
generating the random seed whose pulse width corresponds to the process variation code.

11. The method of claim 8, wherein the generating the random seed based on the process variation information includes:
activating the random seed in response to activation of a second signal;
generating a feedback signal by delaying the random seed by a delay value corresponding to the process variation code; and
deactivating the random seed in response to activation of the feedback signal.

12. The method of claim 8, wherein a pulse width of the random seed and a pulse width of the random signal are in a proportional relationship.

* * * * *